(12) United States Patent
Soda

(10) Patent No.: US 8,124,322 B2
(45) Date of Patent: Feb. 28, 2012

(54) METHOD FOR MANUFACTURING SEMICONDUCTOR DEVICE, AND METHOD FOR PROCESSING ETCHING-TARGET FILM

(75) Inventor: Eiichi Soda, Ibaraki (JP)

(73) Assignee: Renesas Electronics Corporation, Kanagawa (JP)

( * ) Notice: Subject to any disclaimer, the term of this patent is extended or adjusted under 35 U.S.C. 154(b) by 789 days.

(21) Appl. No.: 12/134,492

(22) Filed: Jun. 6, 2008

(65) Prior Publication Data

US 2009/0123875 A1 May 14, 2009

(30) Foreign Application Priority Data

Nov. 14, 2007 (JP) ................................ 2007-295394

(51) Int. Cl.
G03F 7/26 (2006.01)
(52) U.S. Cl. ....................................................... 430/313
(58) Field of Classification Search .................. 430/313, 430/316; 216/58, 72
See application file for complete search history.

(56) References Cited

U.S. PATENT DOCUMENTS 6,136,511 A * 10/2000 Reinberg et al. .............. 430/313

(Continued)

FOREIGN PATENT DOCUMENTS

| JP | 2002-270584 | 9/2002 |
|---|---|---|
| JP | 2004-193627 | 7/2004 |
| JP | 2005-072518 | 3/2005 |

(Continued)

OTHER PUBLICATIONS

Japanese Official Action—JP2007-295394—Dec. 20, 2011.

*Primary Examiner* — Kathleen Duda
*Assistant Examiner* — Caleen Sullivan
(74) *Attorney, Agent, or Firm* — Young & Thompson

(57) ABSTRACT

The present invention provides a method for processing an etching-target film, which can achieve both of a highly precise dry etching process and a reduction of LER. A method for processing an etching-target film, comprises: forming, in sequence from the bottom, an organic mask layer 40, a silicon-containing layer 50 and a resist layer 70, over an etching-target film; forming a predetermined pattern in the resist layer 70 by a photolithography process; etching the silicon-containing layer 50 through a mask of the resist layer 70 by employing a first etching gas; etching the organic mask layer 40 through a mask of the etched silicon-containing layer 50 by employing a second etching gas; and etching the etching-target film through a mask of the etched organic mask layer 40 by employing a third etching gas, wherein the first etching gas contains trifluoroiodomethane ($CF_3I$).

16 Claims, 4 Drawing Sheets

U.S. PATENT DOCUMENTS

| | | | |
|---|---|---|---|
| 6,485,988 B2 * | 11/2002 | Ma et al. | 438/3 |
| 6,828,055 B2 * | 12/2004 | Kearl | 429/423 |
| 7,371,690 B2 | 5/2008 | Negishi et al. | |
| 2004/0266134 A1 * | 12/2004 | Huang et al. | 438/424 |
| 2007/0161255 A1 * | 7/2007 | Pau et al. | 438/778 |

FOREIGN PATENT DOCUMENTS

| | | |
|---|---|---|
| JP | 2006-32721 | 2/2006 |
| JP | 2007-273866 | 10/2007 |
| WO | 2007/116964 | 10/2007 |

\* cited by examiner

METHOD FOR MANUFACTURING SEMICONDUCTOR DEVICE, AND METHOD FOR PROCESSING ETCHING-TARGET FILM

This application is based on Japanese patent application No. 2007-295,394, the content of which is incorporated hereinto by reference.

BACKGROUND

1. Technical Field

The present invention relates to a technology for processing a film to form a pattern by dry etching.

2. Related Art

In recent years, decreasing feature size is progressed in the fields of semiconductor devices, liquid crystal display units, optical devices or the like. For example, interconnect trenches patterned in an interlayer insulating film via a back-end process or gate oxide films or contact holes patterned via a front-end process are decreased in semiconductor devices. Besides, downscaling in thin film transistors (TFT), in which a voltage is applied to a liquid crystal molecule to drive thereof, are proceeded in liquid crystal display units. Besides, downscaling of optical guides or the like, which are patterned on a film or a substrate, are proceeded in optical devices.

Here, in the process of dry etching films, an influence of an irregularity created in the side surface of the formed pattern (line edge roughness, hereinafter referred to as "LER") relatively increases, as the level of the downscaling of the pattern is progressed. In particular, when patterned lines such as interconnect trenches are formed, an influence of the LER formed on the side wall of the lines becomes a serious problem. When the LER increases, problems related to, for example, interconnect trenches in a semiconductor device, such as an increase in the electric resistance due to an electronic scattering in the interconnect side wall, an increase in the leakage current between the interconnects, a decrease in the interconnect life and the like are generated. Similarly, a scattering of electron in the thin film transistor of the liquid crystal display unit or a scattering of light in the optical guide of the optical device are also caused due to an increase of the LER to become a problem.

Various methods are known for forming interconnect trenches in semiconductor devices by a dry etching process. For example, Japanese Patent Laid-Open No. 2002-270,584 describes a technology for processing an interlayer insulating film that is provided with a multiple-layered resist structure including from the top, an overlying resist layer/an organic silicon oxide layer/an underlying organic layer deposited in sequence.

When the dry etch process is proceeded, a thickness of a resist film serving as a mask, as well as a thickness of an etching-target film exposed from the resist film, will be gradually decreased from an initial thickness. According to the investigation of the present inventors, it has been found that smaller thickness of the remained resist film remained on the surface of the etching-target film in the end time of the dry etch process causes larger LER in the side surface of the pattern formed on the etching-target film. It has been also found according to the investigation of a present inventor that larger surface roughness of the resist film during the etch process causes larger LER in the side surface of the pattern formed on the etching-target film.

As described in the above-described Japanese Patent Laid-Open No. 2002-270,584, a multiple-layered resist film exhibiting different etch selectivity for the upper and lower layers (overlying resist layer and underlying organic layer) and the middle layer (organic silicon oxide layer) are employed, so that a certain larger initial thickness of the underlying organic layer that serves as a mask for an etching-target film (an interlayer insulating film) can be ensured.

However, as described in the above-described Japanese Patent Laid-Open No. 2002-270,584, a larger LER is generated in the silicon-containing layer in a conventional process, in which a silicon-containing layer (organic silicon oxide layer) provided as a middle layer in the multiple-layered resist films is dry etched with a gaseous mixture of tetrafluoro carbon ($CF_4$), oxygen and argon. It is clarified by the investigations of the present inventors that a generation of such LER is resulted from a reduced amount of the remained overlying resist layer and an increased surface roughness of the overlying resist layer. It is also, in turn, clarified by the investigations of the present inventors that a larger LER generated in the silicon-containing layer also causes a larger LER in the etching-target film that will be finally etched. On the other hand, a requirement for conducting a patterning process for the resist layer with an extremely higher resolution by employing an exposing apparatus is arisen in recent years, due to miniaturizations in the linewidth of the interconnect or the line intervals between the interconnects in the semiconductor device. Therefore, an initial film thickness of the resist layer is preferable to be fallen within a shallow focal depth of an exposing apparatus, and thus an initial film thickness of a resist layer is generally on a declining trend. In addition, when an etched depth in the multiple-layered resist films is increased to provide an increased ratio of length and width (aspect ratio) that is larger than a predetermined ratio, a problem of the resist film being easily collapsed is arisen. As described above, it is difficult to ensure the thickness of the remained resist film to be larger than a predetermined thickness at the end point of the dry etching process in recent years by providing sufficiently larger thickness of the resist film provided over the etching-target film.

The present invention is made according to the above-described circumstances, and thus the invention provides a processing method, which can achieve both of a highly precise dry etching process and a reduction of an LER. Further, the present invention in particular provides a method for manufacturing a semiconductor device including an operation of processing an etching-target film formed over a semiconductor substrate with an improved accuracy and a reduced LER.

SUMMARY

According to one aspect of the present invention, there is provided a method for manufacturing a semiconductor device, comprising: forming, in sequence from the bottom, an organic mask layer, a silicon-containing layer and a resist layer, over an etching-target film provided over a substrate; forming a predetermined pattern in the resist layer by a photolithography process; etching the silicon-containing layer through a mask of the resist layer by employing a first etching gas to form a transferred pattern therein that is equivalent to the predetermined pattern; etching the organic mask layer through a mask of the etched silicon-containing layer by employing a second etching gas to form a transferred pattern therein that is equivalent to the predetermined pattern; and etching the etching-target film through a mask of the etched organic mask layer by employing a third etching gas to form a transferred pattern therein that is equivalent to the predetermined pattern, wherein the first etching gas contains trifluoroiodomethane ($CF_3I$).

According to the above-described aspect of the present invention, a re-deposition of an etching reaction product in the process for dry etching the silicon-containing layer is reduced by employing $CF_3I$ for the first etching gas. Thus, a generation of a LER in the silicon-containing layer is inhibited. According to investigations of the present inventors, it is found that an LER generated in an upper layer during a dry etching process concatenatively causes another LER in a lower layer. Therefore, according to the above-described aspect of the present invention, the pattern is created with higher resolution in the etching-target film, which is eventually etched through the etching processes for the organic mask layer and for the etching-target film, and a creation of an LER in the etching-target film is also inhibited.

The above-described aspect of the present invention may further be configured that the etching-target film contains an organic silicon-containing material, an inorganic silicon-containing material having alkyl group or only an inorganic silicon-containing material, and wherein the third etching gas contains $CF_3I$.

According to the such aspect, an improved etch rate for the etching-target film in the process for etching the etching-target film can be achieved, while a creation of a re-deposited material is reduced. Thus, the patterning of the etching-target film with higher resolution and a reduction of the LER can be achieved.

The above-described aspect of the present invention may further be configured that the third etching gas contains substantially no oxidizing gas and the second etching gas contains an oxidizing gas. Here, the oxidizing gas is a gas containing oxygen atom (O) in its molecular.

According to such aspect, a damage provided the etching-target film by the third etching gas can be reduced in the operation of etching the etching-target film, while maintaining a sufficient etch rate for the silicon-containing film serving as the etching-target film. This allows providing a smaller LER in the etching-target film (reducing a creation of an LER).

The above-described aspect of the present invention may further be configured that the etching-target film is composed of a porous organic silicon oxide material. According to such aspect, the above-described effect exhibited in the operation for etching the etching-target film is more considerable.

The above-described aspect of the present invention may further be configured to additionally comprise forming an antireflective layer between the silicon-containing layer and the resist layer.

The presence of the antireflective layer formed between the silicon-containing layer and the resist layer allows the patterning of the resist layer serving as an overlying layer of the silicon-containing layer with higher resolution by a photolithography process. In addition, the anti-reflection film provides a protection for the silicon-containing layer during the operation for etching the organic mask layer, and also, together with the silicon-containing layer, serves as a middle layer. This provides a thicker middle layer, achieving further protection for the organic mask layer. This ensures larger initial thickness of the resist film in the operation for etching the etching-target film, thereby eventually reducing a generation of the LER in the etching-target film.

According to another aspect of the present invention, there is provided a method for processing an etching-target film, comprising: forming, in sequence from the bottom, an organic mask layer, a silicon-containing layer and a resist layer, over an etching-target film; forming a predetermined pattern in the resist layer by a photolithography process; etching the silicon-containing layer through a mask of the resist layer by employing a first etching gas to form a transferred pattern that is equivalent to the predetermined pattern; etching the organic mask layer through a mask of the etched silicon-containing layer by employing a second etching gas to form a transferred pattern that is equivalent to the predetermined pattern; and etching the etching-target film through a mask of the etched organic mask layer by employing a third etching gas to form a transferred pattern that is equivalent to the predetermined pattern, wherein the first etching gas contains trifluoroiodomethane ($CF_3I$).

According to such aspect of the present invention, an improved selectivity and a reduced re-deposition are achieved in the operation for etching the silicon-containing layer. This reduces a surface roughness of the resist layer during the process for etching the silicon-containing layer, thereby reducing a creation of LER in the silicon-containing layer. Thus, the organic mask layer is etched to provide an improved quality of the etched product in the operation for etching the organic mask layer through a mask of the silicon-containing layer. Therefore, the pattern is created with higher resolution in the etching-target film, which is eventually etched through the etching process for the etching-target film. A creation of the LER in the etching-target film, in turn, is also inhibited.

The present invention provides the method for processing the etching-target film and the method for manufacturing the semiconductor device, which achieves a pattern processing of the etching-target film with an improved resolution and a reduced LER.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
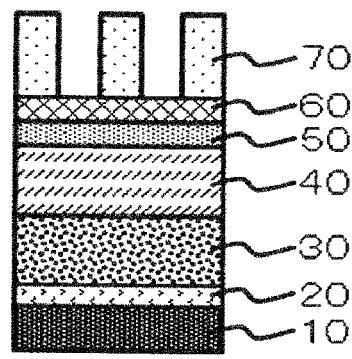
FIGS. 1A to 1E are schematic cross-sectional views of a semiconductor device, illustrating a method for manufacturing the semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments of the present invention will be described below, in reference to the annexed figures. FIGS. 1A to 1E are schematic diagrams, illustrating a method for manufacturing of a semiconductor device 100 according to an embodiment of the present invention. In this regard, a semiconductor substrate, transistors/electrodes formed over the substrate or the like are not shown in these diagrams.

A method for manufacturing of the semiconductor device 100 of the present embodiment includes an operation of forming, in sequence from the bottom, an organic mask layer 40, a silicon-containing layer 50 and a resist layer 70, over an etching-target film (interlayer insulating film 30) provided over the semiconductor substrate, and an operation of forming a predetermined pattern in the resist layer 70 by a photolithography process. The method for manufacturing of the present embodiment also includes a first etching operation for etching the silicon-containing layer 50 through a mask of the resist layer 70 by employing a first etching gas to form a transferred pattern that is equivalent to the above-described predetermined pattern, a second etching operation for etching the organic mask layer 40 through a mask of the silicon-containing layer 50 that is etched in the first etching operation, by employing a second etching gas to form a transferred pattern that is equivalent to the above-described predetermined pattern, and a third etching operation for etching the etching-target film (interlayer insulating film 30) through a mask of the organic mask layer 40 that is etched in the second etching operation, by employing a third etching gas to form a transferred pattern that is equivalent to the above-described predetermined pattern.

In the method for manufacturing the device according to the present embodiment, the first etching gas contains trifluoroiodomethane ($CF_3I$).

In the semiconductor device 100 obtained by the method for manufacturing the device according to the present embodiment, an antireflective layer 60 (antireflective coating; ARC) may be provided between the silicon-containing layer 50 and the resist layer 70, as shown in the diagrams. Besides, other type of interposed layer such as a cap layer and the like may be provided under the multiple-layered resist films composed of the organic mask layer 40, the silicon-containing layer 50 and the resist layer 70. Further, an underlying interconnect layer 10 and an etch stop layer 20, in this sequence from the bottom, may be previously deposited between the semiconductor substrate and the etching-target film (interlayer insulating film 30) as shown in the diagrams. More specifically, as shown in the diagrams, the underlying interconnect layer 10 may be provided or a transistor layer may be provided under the interlayer insulating film 30, which is to be dry etched in the method for manufacturing the device according to the present embodiment.

The underlying interconnect layer 10 is a layer having a metallic interconnect previously formed with the same material and in the same process as employed in forming the interlayer insulating film 30 as described below. More specifically, the method for manufacturing the semiconductor device according to the present embodiment may be repeatedly implemented for multiple cycles on the semiconductor substrate. Further, silicon carbide (SiC) or silicon carbonitride (SiCN) may be preferably formed to be employed for the etch stop layer 20 that provides a stop of the third etching operation.

Next, the interlayer insulating film 30 composed of a low dielectric constant (low-k) material serving as the etching-target film in the present embodiment is deposited. The relative dielectric constant k of the interlayer insulating film 30 may be preferably equal to or lower than 3.0, and more preferably equal to or lower than 2.5. A porous silicon oxycarbide (p-SiOC) may be preferably employed for the interlayer insulating film 30, in view of providing a higher dielectric constant. The interlayer insulating film 30 composed of p-SiOC is deposited by, for example, a plasma chemical vapor deposition (CVD) process with tetramethylsilane gas.

Other materials available in forming the interlayer insulating film 30 may include: polyhydrogensiloxanes such as hydrogen silsesquioxane (HSQ), methyl silsesquioxane (MSQ) or methylated hydrogen silsesquioxane (MHSQ); aromatic compound-containing organic materials such as polyarylether (PAE), divinylsiloxane-bis-benzocyclobutene (BCB); SiLK$^{TR}$ (semiconductor dielectric resins: commercially available from Dow Chemical Company); spin on glass (SOG); FOX$^{TR}$ (flowable oxide: commercially available from Dow Corning Corporation) Cytop$^{TR}$ (amorphous fluororesins: commercially available from Asahi Glass Co., Ltd.); or any porous materials thereof.

Next, the organic mask layer 40, the silicon-containing layer 50, the ARC 60 and the resist layer 70 are applied in this sequence over the interlayer insulating film 30, and are then baked to form the films. Next, a predetermined pattern is formed in the resist layer 70 by a photolithography process including argon fluoride (ArF) immersion exposure and development. As shown in FIG. 1A, trench-like patterned lines (trench pattern) are formed as a pattern for the resist in the present embodiment. Then, as shown in FIG. 1B to FIG. 1E, similar trench pattern is also formed in the interlayer insulating film 30 through the first to third etching operations.

I-line resists typically represented by novolac resin, acrylic resins or copolymers thereof, or krypton fluoride (KrF) resists typically represented by polyhydroxystyrene and the like are employed for the organic mask layer 40 Benzene or naphthalene may be preferably contained in the organic mask layer 40, in view of providing an improved etching resistance.

The silicon-containing layer 50 is composed of a material containing silicon atom (Si) such as, for example, an organic silicon oxide layer. The organic silicon oxide layer is an organic film having silicon atom (Si) and oxygen (O) atom in its structure such as polysilsesquioxane and the like. When such organic silicon oxide layer is employed for the silicon-containing layer 50, preferable atomic concentration of Si is within a range of from 10 to 40 atomic %. Further, in consideration of achieving an increased etching selectivity of the organic silicon oxide layer over the organic mask layer 40, more preferable atomic concentration of Si is within a range of from about 25 atomic % to about 30 atomic %. Alternatively, other type of silicon-containing material such as silicon nitride (SiN), silicon carbide (SiC) and the like may be deposited to form films for the silicon-containing layer 50 of the present embodiment.

An organic film may be preferably employed for the ARC 60, which may be optionally provided between the silicon-containing layer 50 and the resist layer 70. Further, a silicon atom may be contained in the chemical structure of the ARC 60. More specifically, a mixture of a chemical product, which is obtained by reacting a heterocyclic compound with a derivative of benzoic acid substituted with halogen such as bromine or iodine, and a cross-linking agent is applied over the silicon-containing layer 50, and the coated mixture is thermally cured, so that the ARC 60 can be obtained.

A resist for ArF immersion exposure process, for example, may preferably be employed for the resist layer 70, and in particular, an organic material having a backbone of polymethacrylate may more preferably be employed. The resist layer 70 may be deposited by applying a resin composition, or may be deposited by a CVD process.

As described above, the present embodiment is configured to have the ARC 60 provided within the multiple-layered (3 layers) resist structure, which is composed of the organic mask layer 40, the silicon-containing layer 50 and the resist layer 70.

Figure 1B:
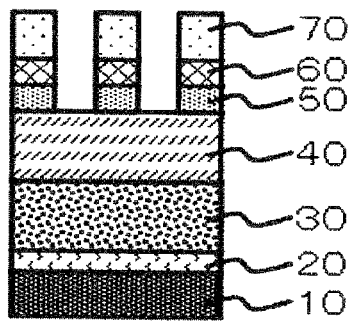

Next, the ARC 60 and the silicon-containing layer 50 are vertically dry etched with the first etching gas through a mask of the resist layer 70 that serves as an ArF immersion resist (FIG. 1B). At this time, the presence of the ARC 60, together with the underlying silicon-containing layer 50, helps increasing the etch selectivity of the resist layer 70 in the first etching operation. This allows reducing the LER created in the silicon-containing layer 50, and the LER created in the organic mask layer 40 during the second etching operation is also reduced. This provides an increased initial film thickness of the mask provided to the interlayer insulating film 30 in the third etching operation for etching the interlayer insulating film 30 (etching-target film). Therefore, the LER created in the etching-target film during the third etching operation is reduced.

$CF_3I$ is contained the first etching gas as essential constituent, and is excited to be employed for the etching process. The first etching gas may additionally contain gases of argon (Ar) and/or oxygen gas ($O_2$) and/or nitrogen gas ($N_2$).

In order to vertically shape the etched pattern with higher processing accuracy, it is preferable to have a shorter gas residence time of the etching gas and to prevent the re-deposited material from being adhered onto the side wall of the processed pattern. Preferable approaches to achieve such condition are to provide an increased flow rate of $CF_3I$ and/or to add gases such as Ar, $O_2$, $N_2$ and the like to $CF_3I$ Among these approaches, the addition of $N_2$ is particularly helpful in reducing a re-deposition in the first etching operation, while providing larger etch rates for the ARC 60 and the silicon-containing layer 50. The addition of $N_2$ also induces a reduced reactivity of the first etching gas with the resist layer 70, as compared with the addition of an oxidizing gas such as $O_2$, so that a weight loss of the resist layer 70 in the first etching operation is reduced.

A typical gas flow rates of the first etching gas may be: 1 to 300 sccm (standard cubic centimeter per minute) for $CF_3I$; 0 to 1,000 sccm for Ar; and 0 to 500 sccm for $N_2$.

An etching apparatus may preferably be a type of an apparatus, which utilizes a plasma technology of a capacitive coupled plasma (CCP) or a plasma technology of an inductive coupled plasma (ICP).

In ordinary dry etching processes, an alternating voltage (source power) is applied to an RF source disposed on the top of the chamber to create a plasma. Then, an alternating voltage (bias power) is applied to an RF source disposed on the bottom of the chamber to draw ions in the plasma to a wafer disposed in the lower part of the interior of the chamber, so that the plasma is applied with higher anisotropy. In order to reduce a damage to the interlayer insulating film 30 (p-SiOC film) in the present embodiment, it is preferable to apply a bias power without increasing the plasma density to simultaneously achieve a generation of a plasma and a drawing of ions. The source power may preferably be within a range of, for example, 0 W to 2,000 W, and an additional bias power may be preferably applied. Specific level of the bias power may be within a range of, for example, 10 W to 2,000 W.

As other etching conditions may include, for example, a pressure of the etching gas of 1 to 300 mTorr, a flow rate of $CF_3I$ of 10 to 1,000 sccm, and so on. Here, the pressure range of the etching gas may be within a range of, for example, from 1 to 760 mTorr. Further, the temperature of the semiconductor substrate may preferably be within a range of from −20 degree C. to 400 degree C.

In etching the ARC 60 and/or the silicon-containing layer 50 to form a predetermined pattern by employing the first etching gas, the etching selectivity of the ARC 60 or the silicon-containing layer 50 over the resist layer 70 or a possibility of a creation of a re-deposited material in the etching process on these layers should be considered.

Conventionally, a fluorocarbon gas such as perfluorocarbon (PFC) is generally employed as an etching gas for the ARC 60 or for the silicon-containing layer 50.

Fluorocarbon gases may be generally classified into high order gases having two or more carbons in their molecule such as tetrafluoroethylene ($C_2F_4$), hexafluoroethane ($C_2F_6$), octafluorocyclobutane ($C_4F_8$), octafluorocyclopentene ($C_5F_8$), hexafluoro-1,3-butadiene ($C_4F_6$) and the like, and low-molecular-weight gases having one carbon atom in their molecule such as tetrafluoro carbon ($CF_4$), trifluoromethane ($CHF_3$), difluoromethane ($CH_2F_2$), fluoromethane ($CH_3F$) and the like. In order to achieve higher etching selectivity of the ARC 60 and/or the silicon-containing layer 50 over the resist layer 70, such high order gas is preferably employed, which, on the other hand, leads to a disadvantage of creating an increased amount of the re-deposition material. The increased amount of the re-deposition material, in turn, leads to an unwanted geometry of the silicon-containing layer 50 having an increased level of LER, providing an adverse effect on the geometry of the pattern. It is found by the investigations of the present inventors that, when the high order gas is employed for the first etching gas, a re-depositing material containing fluorocarbon as a major constituent is adhered to the resist layer 70 in higher volume to create a wiggling feature in the resist layer 70, which leads to a generation of a considerable level of LER in the silicon-containing layer 50.

While a use of the low-molecular-weight gas provides a reduced amount of re-depositing material to an improved geometry of the interconnect, the use of the low-molecular-weight gas causes a deterioration of the selectivity of the ARC 60 or the silicon-containing layer 50 over the resist layer 70. In the conventional processes, $CF_4$ having one carbon atom and higher fluorine-containing ratio in its molecule have been often utilized.

However, the investigations of the present inventors clarify that a use of a fluorocarbon gas having one carbon atom and three or less fluorine atoms in its molecule provides a preferable etch rate for films that contain an organic silicon-containing material, an inorganic silicon-containing material having alkyl group or only an inorganic silicon-containing material. In particular, a use of $CF_3I$ exhibits higher etch rate and lower level of re-deposition. Thus, the present embodiment is configured that the silicon-containing layer 50 included in the multiple-layered resist films, which include the organic mask layer 40, the silicon-containing layer 50 and the resist layer 70, is dry-etched with $CF_3I$. This provides advantageous effects, in which the LER in the silicon-containing layer 50 is reduced, the organic mask layer 40 serving as a mask for the interlayer insulating film 30 is remained to have a sufficient thickness in the end of the second etching operation, and the LER in the interlayer insulating film 30 is reduced.

A mechanism representing a fact that $CF_3I$ is preferable for dry etching a film containing both of an organic silicon-containing material and an inorganic silicon-containing material or a film containing only an inorganic silicon-containing material will be described below, in reference to the following research papers.

[1] S. Samukawa et al., Jpn. J. Appl. Phys. Vol. 37, pp. L1095 (1998);

[2] L. G. Christphorou et al., J. Phys. Chem. Ref. Data, vol. 29, pp. 553, (2000); and

[3] S. Samukawa et al, J. Vac. Sci. Technol. A, vol. 17, pp. 2551, (1999).

First of all, it should be pointed out that $CF_3I$ is low-molecular-weight fluorocarbon gas having one carbon atom, and generates less re-deposition. $CF_3I$ is also characterized in that strength of ultraviolet radiation of excited $CF_3I$ within the etching plasma thereof in wavelength of 100 nm to 300 nm is smaller, as compared with that of C4F6 and $CF_4$. Since energy of ultraviolet light having a wavelength within the ultraviolet range is higher than bond energies of C—C bond, C—H bond or C—O bond contained in the resist for ArF immersion lithography (resist layer 70), it is considered that the irradiation of ultraviolet light causes a dissociation of the bonding or damages the bonding. Further, since bond energy of C—I bond (2.4 eV) is smaller than bond energy of C—F bond (5.6 eV) in $CF_3I$ plasma, selective dissociation of C—I bond is caused in such plasma to create larger quantity of $CF_3$ radical or $CF_3$ ion with an improved efficiency. Since $CF_3$ ion constitutes an etching for SiO, the etch rate for the silicon-containing layer 50 is increased. Further, even if fluorine (F) radical is generated, iodine (I) serving as a scavenger for F reacts with F to create iodine monofluoride (FI) immediately after F radical is created, and therefore the quantity of the generated F radical is smaller. F radical reacts with carbon (C) in the resist layer 70 to create C—F bond.

Therefore, due to a weak strength of emitted UV and smaller amount of created F radical, a use of $CF_3I$ provides a reduced etch rate for the resist layer 70, which is ordinarily employed, as compared with a use of $CF_4$. Further, since an increased amount of created $CF_3$ ion provides an increased etch rate for the silicon-containing layer 50, the etching selectivity of the resist layer 70 over the silicon-containing layer 50 is increased by 1.5 times, as compared with the etching with $CF_4$. On the contrary, the etching selectivity of the resist layer 70 over the ARC 60 is maintained in the same level as that achieved in the etching process with $CF_4$. According to the above-described reasons, a use of $CF_3I$ for the first etching gas allows providing a reduced profile of the resist layer 70. Further, a reduced reactivity of the etching gas with the resist can provide a reduced level of roughness in the surface of the resist layer 70 at the end of the first etch operation, as compared with etching process with an etching gas containing $CF_4$.

This allows reducing the LER of the silicon-containing layer 50. Further, advantageous effects of remaining sufficient thickness of the organic mask layer 40 serving as a mask for the interlayer insulating film 30 at the end of the second etch operation and reducing the LER created in the organic mask layer 40 are obtained. This allows reducing the generation of the LER that possibly be formed in the interlayer insulating film 30 in the third etching operation.

Besides, as compared with other types of etching gases such as hydrogen bromide (HBr), chlorine ($Cl_2$), nitrogen trifluoride ($NF_3$), sulfur hexafluoride ($SF_6$) or the like, $CF_3I$ is particularly suitable for the etching gas, in view of providing an enhanced etch rate over the porous SiOC or providing a suitable shape control.

Figure 1C:
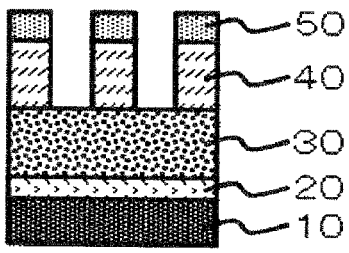

In the second etching operation, the organic mask layer 40 is vertically etched through a mask of the silicon-containing layer 50, which has been patterned to form a certain geometry in the first etching operation (FIG. 1C). In addition to above, when the resist layer 70 and the ARC 60 are remained on the silicon-containing layer 50, the etching of the organic mask layer 40 is achieved through a mask of such multiple-layered resist films. In the second etching operation, the second etching gas containing an oxidizing gas such as $O_2$/Ar plasma is employed. In such operation, the resist layer 70 remained on the ARC 60 and the ARC 60 itself are totally or partially disappeared.

Figure 1D:
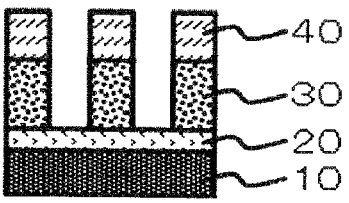

In the third etching operation, a vertical etching for the interlayer insulating film 30 is conducted by employing the third etching gas through a mask of the organic mask layer 40, which has been patterned to form a certain geometry in the second etching operation (FIG. 1D). In addition to above, when the silicon-containing layer 50 is remained on the organic mask layer 40 in such case, the etching of the interlayer insulating film 30 is also achieved through a mask of such films.

While fluorocarbon gas such as $CF_4$-containing gas may be employed for the third etching gas, a use of $CF_3I$ may also be preferable in the present embodiment, in place of employing $CF_4$-containing gas. As described above, $CF_3I$ is advantageous in terms of providing an improved etch rate and a reduced re-deposition for a film containing both of an organic silicon-containing material and an inorganic silicon-containing material or a film containing only an inorganic silicon-containing material. Thus, the etching process for the interlayer insulating film 30 is conducted with an improved quality. Further, when a material having serious brittleness such as p-SiOC and the like is employed for the etching-target film (interlayer insulating film 30) as in the present embodiment, a use of $CF_3I$, which particularly promotes an increase in the selectivity of the organic mask layer 40 over the interlayer insulating film 30 to reduce a generation of a re-deposition, is effective. Further, a pressure for the third etching operation may preferably be equal to or lower than several tens mTorr, in order to reduce an elimination of methyl group ($CH_3$) caused by a diffusion of F plasma in the porous SiOC.

Further, an addition of Ar and $N_2$ to $CF_3I$ preferable in terms of providing a reduced generation of re-deposition and an improved perpendicularity in the geometry of the etched feature. However, an addition of $O_2$ is not preferable, since a reactivity thereof with $CH_3$ group in the porous SiOC is considerably higher to cause an increased film damage. As described above, in the present embodiment, the third etching contains substantially no oxidizing gas, and the second etching gas contains an oxidizing gas.

Further, $CF_3I$ is employed for both of the major constituents of the first etching gas and the third etching gas, so that re-depositions of both of the multiple-layered resist film and the etching-target film are reduced. Further, since the level of the re-deposition generated in the second etching operation is generally smaller, common material is employed for the major constituents of the first etching gas and the third etching gas, so that the first to the third etching operations can be carried out in the commonly utilized etching chamber.

Figure 1E:
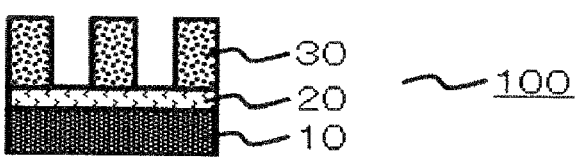

Finally, the remained organic mask layer 40 is removed by utilizing a plasma containing hydrogen gas ($H_2$), which causes less damage to the porous SiOC, such as, for example, $H_2$/He plasma and the like, so that the interlayer insulating film 30 having a predetermined pattern processed therein is remained on the underlying interconnect layer 10 (FIG. 1E).

The method for manufacturing of the semiconductor device 100 according to the present embodiment as described above is characterized that the first etching gas contains $CF_3I$. According to such characteristic, higher selectivity is achieved in the etching operation for the antireflective layer 60 and the silicon-containing layer 50 that constitute the multiple-layered resist films. This allows reducing the thickness of the resist layer 70, and further, a reduction in the level of the LER in the silicon-containing layer 50 can be achieved. This allows reducing the level of the LER generated in the processing operation for the etching-target film such as the interlayer insulating film 30 that is etched in the third etching operation.

Further, when the etching-target film is composed of an organic silicon oxide material, in particular a porous organic silicon oxide material such as p-SiOC and the like in the above-described present embodiment, $CF_3I$ is selected for the major constituent of the third etching gas. This provides an improved selectivity of the etching-target film in the third etching operation that is directed for the etching-target film, thereby allowing a reduced thickness of the multiple-layered resist film. Further, an etching process is conducted with higher quality to further reduce the generation of the LER.

While the present embodiment is described above in reference to the processing of the trench-pattern, similar etching process for forming other type of geometry such as, for example, hole-pattern and the like may also be conducted. However, when the formed pattern is a trench-pattern composed of a plurality of trenches disposed in parallel and an interval between central lines of an adjacent pair of the trenches is equal to or smaller than 140 nm as in the above-described embodiment, the influence of the LER is considerable. In particular, when the interval between central lines of the adjacent pair of the trenches is equal to or smaller than 90 nm, the influence of the LER is considerable and it is difficult to obtaining sufficient aspect ratio of the multiple-layered resist film. Consequently, the method for processing films according to the present embodiment employing $CF_3I$ as an etching gas is effective in terms of achieving the processing with higher resolution and lower generation of LER, as compared with conventional method for processing films employing fluorocarbons such as $CF_4$ and the like as an etching gas.

Further, the geometry of the side surface of the trench formed by the method for processing films according to the present embodiment may include $1\sigma$, a dimension of the created irregularity (LER), of equal to or smaller than 2.5% of the dimension of width of the trench, and more specifically, $1\sigma$ may be equal to or smaller than 1.25 nm, in the case of the geometry of the trench having a width of 50 nm. The dimension of the LER here means a dimension of an irregularity formed in a side surface in one side of a trench. By selecting the value of the LER within the above-described range, a generation of an electron-scattering or a leakage current in a metallic interconnect, which will be formed on the trench by a sputter process in the subsequent process operation, can be reduced to a practically allowable level, and thus an improved reliability for the interconnect can also be provided.

Further, since the ARC 60 is less reactive with $CF_3I$ in the first etching operation in the present embodiment employing $CF_3I$ as the first etching gas, the geometry of the etched feature tends to be a forwardly tapered geometry, having a larger opening in the side of the front surface than the side of the bottom. Thus, the width dimension of the bottom end of the remained feature of the ARC 60 is larger than the width dimension of a corresponding mask feature in the patterned mask formed in the resist layer 70. Consequently, the width dimension of the remained feature of silicon-containing layer 50 remained in the first etching operation is larger than the corresponding mask feature in the patterned mask formed in the resist layer 70. Thus, the widths of the silicon-containing layer 50, the organic mask layer 40, and the interconnect trench that is eventually cut in the surface of the interlayer insulating film 30 are smaller than the width of the mask opening of the resist layer 70. Consequently, the interconnect trench having smaller line width, which is smaller than the exposure limitation for the resist layer 70, is formed by a dry etching process. In other words, since the exposure operation can be conducted by utilizing the relatively larger width dimension of the mask feature than the finally etched feature of the trench in the photolithography operation for the resist layer 70, an increased allowance for the exposure process can be ensured Besides, while fluorocarbon gases such as $C_4F_8$, $CF_4$, $C_4F_6$, $C_5F_8$ and the like are traditionally employed for the etching process for the interlayer insulating film 30 composed of p-SiOC and the like, the Global Warming Potential (GWP) of these gases are higher, and specifically 8,700, 6,500, 290 and 90, respectively, and in general, a discharge of a high-GWP gas is a critical problem in recent years. On the other hand, the GWP of $CF_3I$ gas is 1, which is lower than that of these fluorocarbon gases and equivalent to $CO_2$. Thus, the utilization of $CF_3I$ as a gas of an alternative choice for the conventional gas creates an emission credit, which is defined in Kyoto Protocol and is also available in an emissions trading.

EXAMPLES

Example 1

The first etching operation in the above-described embodiment illustrated in FIG. 1A and FIG. 1B were conducted, and evaluations of the obtained multiple-layered resist films were conducted. More specifically, the etch selectivity of the resist layer 70 over the silicon-containing layer 50 was studied.

First of all, an $SiO_2$ film was formed on the silicon substrate, and the following films were sequentially deposited thereon: 30 nm of SiCN serving as the etch stop layer 20; 100 nm of p-SiOC film serving as the interlayer insulating film 30; 60 nm of "dense SiOC" film serving as the cap film; 200 nm of a coated and cured mask composition (TBLM-830: commercially available from Tokyo Ohka Kogyo Co., Ltd.) serving as the organic mask layer 40; 45 nm of a silicon-containing layer 50 (HM series: commercially available from Tokyo Ohka Kogyo Co., Ltd.); 45 nm of a coated and cured composition for an anti-reflection film (ARC 29A: commercially available from Nissan Chemical Industries, Ltd.) serving as the ARC 60; and 120 nm of an ArF immersion resist (TARF-P6329: commercially available from Tokyo Ohka Kogyo Co., Ltd.) serving as the resist layer 70.

Such substrate was exposed and developed by a photolithography process by an ArF immersion to form a patterned resist (patterned lines) having a channel width of 70 nm and a line interval 140 nm of the trenches. Next, through a mask of the resist layer 70 the ARC 60 and the silicon-containing layer 50 were dry etched in a capacitive coupled plasma (CCP) apparatus under the conditions of a pressure of 10 mTorr, a bias power of 800 W and a substrate temperature of 40 degree C. until the organic mask layer 40 was exposed.

$CF_3I$ was employed in the etching gas (first etching gas) for Example 1, and $CF_4$ was employed in the etching gas for Comparative Example 1, and the flow rates for both Examples were set to 130 sccm. Any other addition gas such as Ar in the present Examples, so that a simple comparison for the types of the etching gases was achieved, and the results showed that a trench geometry perpendicular to the multiple-layered resist film was obtained.

Figure 2:
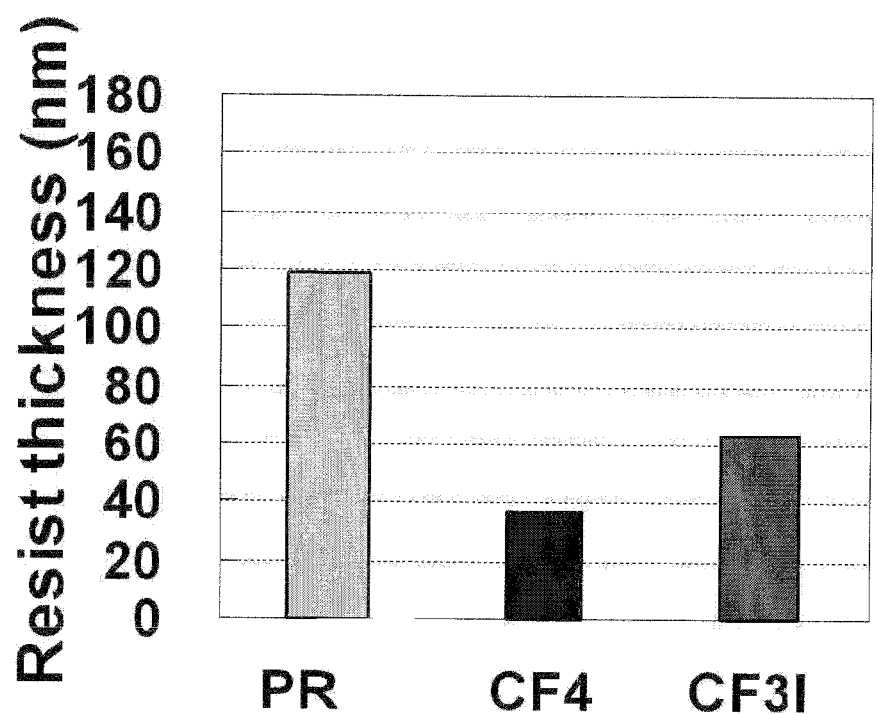
FIG. 2 is a bar graph, showing initial film thicknesses of resist layers 70 in Example 1 and in Comparative Example 1, and a thickness of the remained resist layer 70 after the first etching operation is completed.

FIG. 2 shows an initial film thickness of the resist layer 70 and thicknesses of the remained films after the first etching operation. The left bar in the graph shows an initial film thickness of the resist layer (PR) 70. The center bar in the graph shows a film thickness of the remained resist layer 70 (Comparative Example 1) at the time the first etching operation employing $CF_4$ was finished. The right bar in the graph shows a film thickness of the remained resist layer 70 (Example 1) at the time the first etching operation employing $CF_3I$ was finished. These film thicknesses are obtained from the results of the estimation on the basis of the cross-sectional SEM images. As shown in the graph, it is understood that the remained thickness of the resist layer 70 is larger, since a use of $CF_3I$ for the etching gas provides larger selectivity of the silicon-containing layer 50 over the resist layer 70 than a use of $CF_4$. It was confirmed from the results that $CF_3I$ promotes higher selectivity than $CF_4$.

After the above-described first etching operation was completed, and after the successively conducted second etching operation was completed, the trench geometry of the organic mask layer 40 having the exposed surface of the silicon-containing layer 50, which was obtained after the second etching operation, was evaluated. More specifically, a geometry of the side surface in one side of a trench formed in the silicon-containing layer 50 is measured a critical dimension SEM (CD-SEM) to evaluate an LER created in the silicon-containing layer 50.

Figure 3:
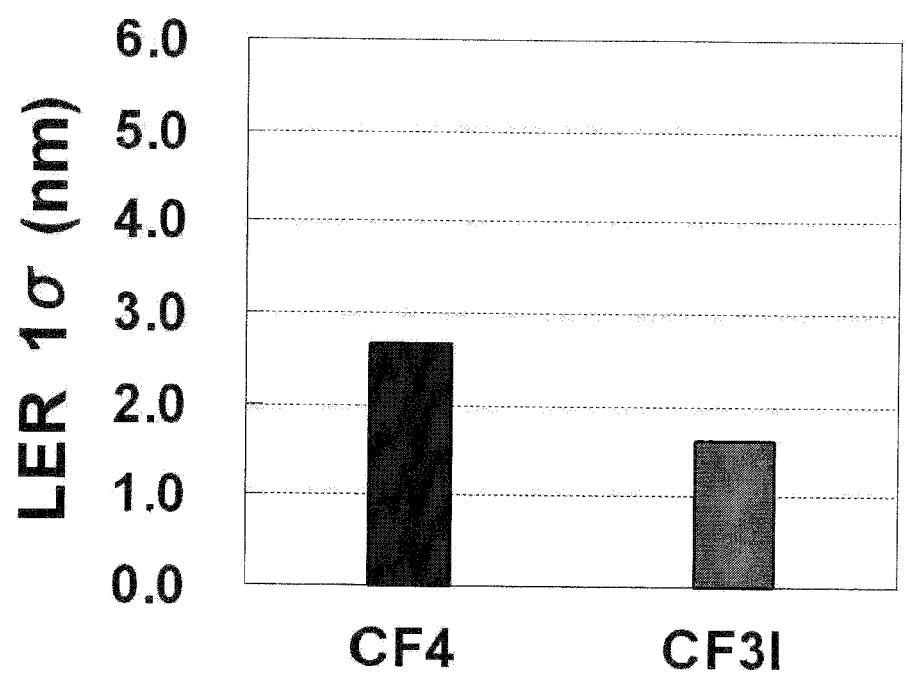
FIG. 3 is a bar graph, showing measured LERs created in the silicon-containing layer 50 at the ends of the first and the second etching operations in Example 1 and in Comparative Example 1.

The results of the LER measured from the CD-SEM is shown in FIG. 3. The left bar represents the measurement result ($1\sigma$) of Comparative Example 1 that utilized $CF_4$ for the first etching gas, and the right bar represents the measurement result ($1\sigma$) of Example 1 that utilized $CF_3I$ for the first etching gas. It can be seen from the results shown in the graph that the use of $CF_3I$ for the etching gas provides a reduced level of the LER generated in the side surface of the etched silicon-containing layer 50, as compared with the case of using $CF_4$, and thus the etching with higher quality is achieved.

Example 2

The first to third etching operations shown in the above-described embodiment in reference to FIGS. 1A to 1E were conducted, and the obtained interlayer insulating film 30 was evaluated. Specifically, in the present example, p-SiOC trenches with the line interval of 100 nm were formed, and electrical characteristics thereof were evaluated.

First of all, similarly as in the above-described Example 1, 30 nm of the etch stop layer 20; 100 nm of the interlayer insulating film 30; 60 nm of the cap film; 200 nm of the organic mask layer 40; 45 nm of the silicon-containing layer 50; 45 nm of the ARC 60; and 120 nm of the resist layer 70 were deposited on the $SiO_2$ film formed on the silicon substrate.

In the present example, an exposure process was conducted by an ArF immersion lithography to form a trench resist pattern with the line interval of 100 nm in the resist layer 70. In such case, a pattern of the interconnect trench 50 nm/space 50 nm (w50/s50) and a pattern of the interconnect trench 52 nm/space 48 nm (w52/s48), which are represented by the dimension of the mask features in the resist layer 70, were formed.

Next, the ARC 60 and the silicon-containing layer 50 were etched through a mask of the resist layer 70 under the process conditions that is similar as in the above-described Example 1 and employing $CF_3I$ for the first etching gas until the organic mask layer 40 is exposed (Example 2). On the contrary, $CF_4$ was employed for the first etching gas to similarly conduct the etching process as Comparative Example 2. The flow rates of the first etching gas were 130 sccm for both of Example 2/Comparative Example 2.

Successively, if the etched silicon-containing layer 50, or the resist layer 70 or the ARC 60 were remained, the organic mask layer 40 was dry etched through mask of the silicon-containing layer 50 and/or the other remained layer(s) with the second etching gas until the cap film is exposed (second etching operation). Further, the interlayer insulating film 30 was dry etched through mask of the etched organic mask layer 40 and the silicon-containing layer 50 remained thereon with the third etching gas until the etching reached to the etch stop layer 20 (third etching operation). $O_2$/Ar plasma was employed for the second etching gas. A gaseous mixture of $CF_4$, Ar and $N_2$ was employed for the third etching gas for Example 2/Comparative Example 2.

Further, patterned lines were formed in the interlayer insulating film 30, and then, an ashing of the organic mask layer 40 was conducted with a gaseous mixture of $H_2$/He, and further, a cleaning operation, a deposition of a barrier film with thallium/thallium nitride (Ta/TaN) and a copper (Cu)-plating operation were carried out, and thereafter electrical characteristics of the obtained product were evaluated.

Figure 4A:
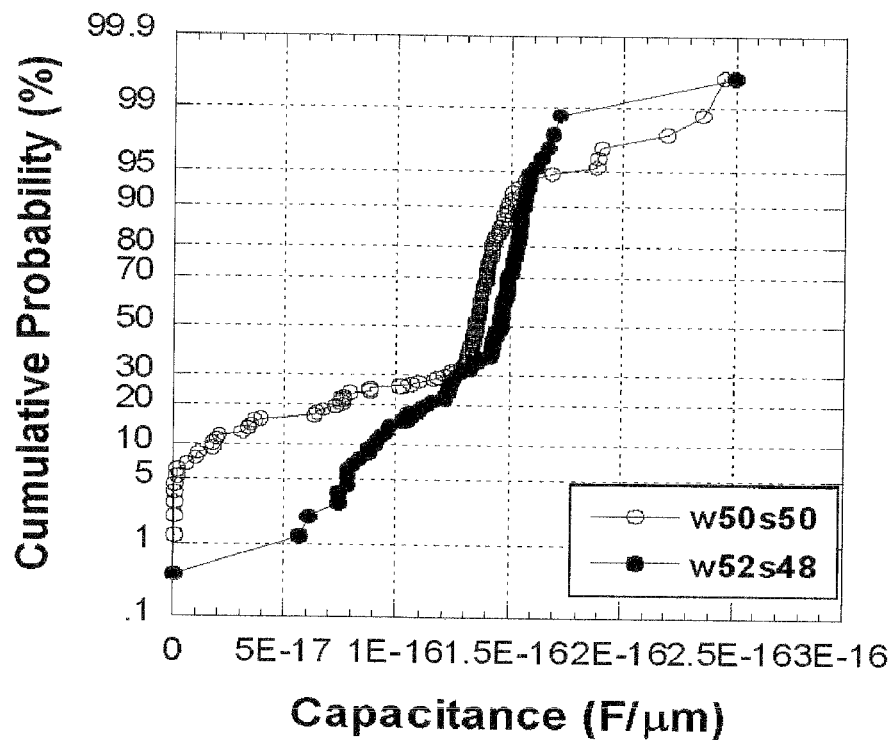
FIG. 4A is a graph, showing interconnect capacity and its cumulative probability in Example 2.
Figure 4B:
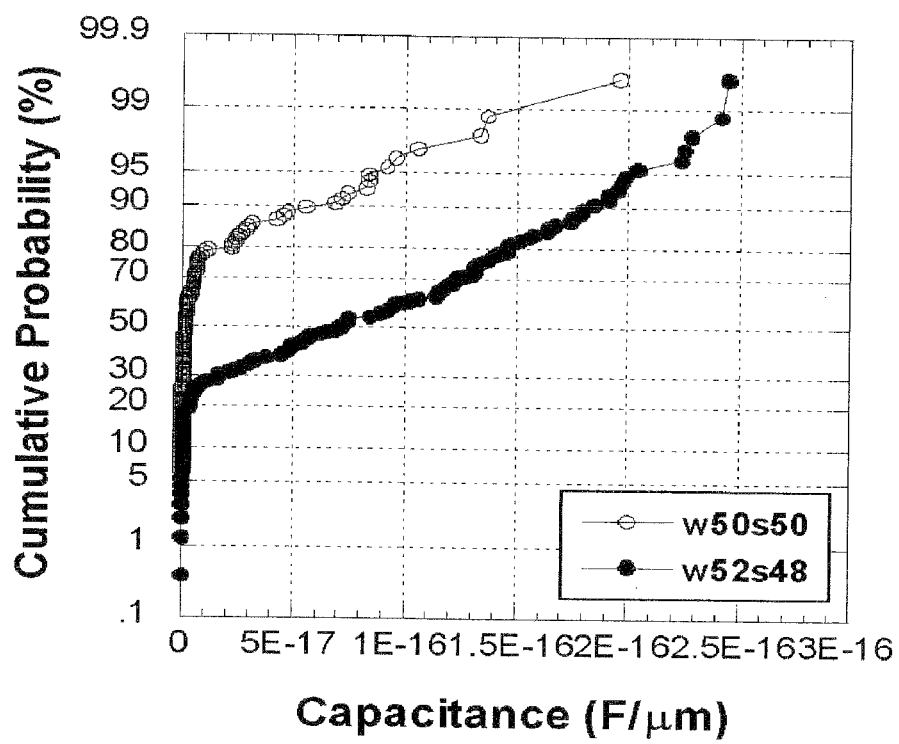
FIG. 4B is a graph, showing interconnect capacity and its cumulative probability in Comparative Example 2.

Electrical characteristics were measured for inter-digital interconnects. The results are shown in FIGS. 4A and 4B. FIG. 4A shows a cumulative probability of an interconnect capacity for Example 2, and FIG. 4B shows a cumulative probability of an interconnect capacity for Comparative Example 2. The cumulative probability was obtained in relation to metallic interconnects in 122 chips (122 locations) formed on each silicon substrate specimen by measuring each of the interconnect capacities between adjacent interconnects for 100 pieces of specimens. White circles (O) represent cumulative probabilities for the features having the ratio of interconnect trench/space as 50 nm/50 nm on the basis of the mask dimension of the resist layer 70, and in other words, the central line geometry (interconnect interval) of the patterned lines was 100 nm. Closed circles (●) represent cumulative probabilities for the features having the ratio of interconnect trench/space as 52 nm/48 nm on the same basis as described above, and thus the interconnect interval was 100 nm, which is the same as the above-described white circles.

As shown in the graph, a peak of the interconnect capacitive is present around $1.5 \times 10^{-6}$ [F/μm] in FIG. 4A related to Example 2, and therefore it is understood that the interconnect trenches and the copper interconnects were stably formed for 100 pieces of silicon substrate sample specimens. On the contrary, a number of sample specimens, in which a leakage was generated between the interconnects to cause zero interconnect capacity, are present in FIG. 4B related to Comparative Example 2, and even if the sample specimens had significant interconnect capacities, the interconnect capacities were dispersed, and the geometries of the interconnect trenches depend on the respective sample specimens, and thus it is understood that larger LER were randomly generated.

According to the results of the above-described Examples/Comparative Examples, it was confirmed that a reduced LER in the etching-target film and improves electrical characteristics are achieved by dry etching the ARC 60 and the silicon-containing layer 50 with the multiple-layered resist film and with $CF_3I$ for the etching gas.

In addition to above, considering all results of the above-described Examples 1 and 2, it is understood that the level of the LER in the interlayer insulating film 30 serving as the etching-target film is reduced by employing $CF_3I$ for both of the first etching gas and the third etching gas. Further, it is also understood that the LER in the interlayer insulating film 30 can be further reduced by adding substantially no oxidizing gas in the third etching gas. This is because a use of $CF_3I$ for the first etching gas reduces the LER generated in the silicon-containing layer 50 constituting a mask at the time of starting the third etching operation. This is also because a use of $CF_3I$ for the third etching gas further reduces the LER generated in the interlayer insulating film 30 during the third etching operation.

As described above, since an influence of an LER over a pattern width is increased and a reduced focal depth is required in exposing apparatuses in dry etching operations in processes for manufacturing semiconductor devices that require an increased level of miniaturization for patterned lines in recent years, the conditions for the processing synergically become more severe, as a reduction in a thickness of a resist film is required and an aspect ratio of an etched feature in a multiple-layered resist film is limited. In such circumstances, uses of $CF_3I$ for both of the first etching gas and the third etching gas as in the present embodiment provides an improved quality in the etching process in a so-called synergic manner, thereby providing solutions for all of the above-described problems.

While the present invention are fully described above in reference to the preferred embodiments, the descriptions of the preferred embodiments are presented for the illustrations of the present invention, and the configurations and the spirits of the present invention may also be adopted in various applications including a formation of interconnect trenches in the interlayer insulating film 30 of the semiconductor device 100. In particular, it is confirmed that a use of $CF_3I$ for an etching gas is generally effective in variety of cases where a film containing an organic silicon-containing material, an inorganic silicon-containing material having alkyl group or a film containing only an inorganic silicon-containing material is employed for an etching-target film. Consequently, concerning the semiconductor devices, the configurations and the spirits of the present invention may also be adopted for a patterning process for a gate oxide film that is provided above a silicon substrate in a front-end operation, or a patterning process for a contact hole provided in an interlayer insulating film. Further, a method for processing films of the present invention may also be adopted in cases of processing an etching-target film containing silicon atom (Si) such as, for example, silicon nitride film, silicon carbide film, polysilicon film and the like.

Alternatively, the method for processing films of the present invention may also be preferably applied for a fine patterning of thin films containing silicon atom (Si) liquid crystal display units such as thin film transistors (TFT) formed on a glass substrate or an $SiO_2$ substrate, or in optical devices such as optical guides formed over an optical device substrate or a film.

It is apparent that the present invention is not limited to the above embodiment, and may be modified and changed without departing from the scope and spirit of the invention.

What is claimed is:

1. A method for manufacturing a semiconductor device, comprising:
    forming, from the bottom, an organic mask layer, an organic silicon oxide layer and a resist layer over an etching-target film provided over a substrate;
    forming a predetermined pattern in said resist layer by a photolithography process;
    etching said organic silicon oxide layer through a mask of said resist layer by employing a first etching gas to form a transferred pattern therein that is equivalent to said predetermined pattern;
    etching said organic mask layer through a mask of said etched organic silicon oxide layer by employing a second etching gas to form a transferred pattern therein that is equivalent to said predetermined pattern; and
    etching said etching-target film through a mask of said etched organic mask layer by employing a third etching gas to form a transferred pattern therein that is equivalent to said predetermined pattern,
    wherein said first etching gas contains trifluoroiodomethane ($CF_3I$).

2. The method for manufacturing the semiconductor device as set forth in claim 1, wherein said etching-target film contains an organic silicon-containing material or an inorganic silicon-containing material, and wherein said third etching gas contains $CF_3I$.

3. The method for manufacturing the semiconductor device as set forth in claim 2, wherein said third etching gas contains substantially no oxidizing gas, and said second etching gas contains an oxidizing gas.

4. The method for manufacturing the semiconductor device as set forth in claim 2, wherein said etching-target film is composed of a porous organic silicon oxide material.

5. The method for manufacturing the semiconductor device as set forth in claim 3, wherein said etching-target film is composed of a porous organic silicon oxide material.

6. The method for manufacturing the semiconductor device as set forth in claim 1, further comprising forming an antireflective layer between said organic silicon oxide layer and the resist layer.

7. The method for manufacturing the semiconductor device as set forth in claim 6, wherein said etching the organic silicon oxide layer includes etching both of said antireflective layer and the organic silicon oxide layer with said first etching gas.

8. The method for manufacturing the semiconductor device as set forth in claim 1, wherein said first etching gas contains nitrogen gas.

9. The method for manufacturing the semiconductor device as set forth in claim 1, wherein said etching the organic silicon oxide layer, said etching the organic mask layer and said etching the etching-target film are all conducted in a common etching chamber.

10. The method for manufacturing the semiconductor device as set forth in claim 1, wherein a pattern formed in said etching-target film is constituted of a plurality of trenches disposed in parallel, and an interval between central lines of adjacent pair of said trenches is equal to or smaller than 140 nm.

11. The method for manufacturing the semiconductor device as set forth in claim 10, wherein a dimension of an irregularity ($1\sigma$) created in a side surface of said trench is equal to or smaller than 2.5% of a width dimension of said trench.

12. A method for processing an etching-target film, comprising:
    forming, from the bottom, an organic mask layer, an organic silicon oxide layer and a resist layer, over the etching-target film;
    forming a predetermined pattern in said resist layer by a photolithography process;
    etching said organic silicon oxide layer through a mask of said resist layer by employing a first etching gas to form a transferred pattern therein that is equivalent to said predetermined pattern;
    etching said organic mask layer through a mask of said etched organic silicon oxide layer by employing a second etching gas to form a transferred pattern therein that is equivalent to said predetermined pattern; and
    etching said etching-target film through a mask of said etched organic mask layer by employing a third etching gas to form a transferred pattern therein that is equivalent to said predetermined pattern,
    wherein said first etching gas contains trifluoroiodomethane ($CF_3I$).

13. The method for processing the etching-target film as set forth in claim 12, wherein said etching-target film contains an organic silicon-containing material or an inorganic silicon-containing material, and wherein said third etching gas contains $CF_3I$.

14. The method for processing the etching-target film as set forth in claim 13, wherein said third etching gas contains substantially no oxidizing gas, and said second etching gas contains an oxidizing gas.

15. The method for processing the etching-target film as set forth in claim 12, further comprising forming an antireflective layer between said organic silicon oxide layer and the resist layer.

16. The method for processing the etching-target film as set forth in claim 15, wherein said etching the organic silicon oxide layer includes etching both of said antireflective layer and the organic silicon oxide layer with said first etching gas.

* * * * *